United States Patent
Irwin, Jr.

(10) Patent No.: US 10,723,618 B2
(45) Date of Patent: Jul. 28, 2020

(54) MICROELECTROMECHANICAL DEVICE WITH MULTIPLE HINGES

(71) Applicant: HEWLETT-PACKARD DEVELOPMENT COMPANY, L.P., Houston, TX (US)

(72) Inventor: Richard B. Irwin, Jr., Plano, TX (US)

(73) Assignee: Hewlett-Packard Development Company, L.P., Spring, TX (US)

(*) Notice: Subject to any disclaimer, the term of this patent is extended or adjusted under 35 U.S.C. 154(b) by 136 days.

(21) Appl. No.: 15/747,759

(22) PCT Filed: Oct. 23, 2015

(86) PCT No.: PCT/US2015/057207
§ 371 (c)(1),
(2) Date: Jan. 25, 2018

(87) PCT Pub. No.: WO2017/069780
PCT Pub. Date: Apr. 27, 2017

(65) Prior Publication Data
US 2018/0215612 A1    Aug. 2, 2018

(51) Int. Cl.
*G02B 26/08* (2006.01)
*G02B 26/10* (2006.01)
(Continued)

(52) U.S. Cl.
CPC .............. *B81B 7/02* (2013.01); *B81B 3/0062* (2013.01); *G02B 26/0833* (2013.01);
(Continued)

(58) Field of Classification Search
CPC .............. G02B 26/0841; G02B 26/105; G02B 26/0833; G02B 26/101; G02B 26/085;
(Continued)

(56) References Cited

U.S. PATENT DOCUMENTS 5,583,688 A    12/1996    Hornbeck
5,768,007 A *   6/1998    Knipe ................ G02B 26/0833
                                                                348/E5.142
(Continued)

FOREIGN PATENT DOCUMENTS

JP          2002250890 A        9/2002
KR      1020020071206 A *       9/2002
(Continued)

OTHER PUBLICATIONS

Irwin, WO2017069780 Written Opinion, dated Oct. 23, 2015, 7 pages.
(Continued)

*Primary Examiner* — William R Alexander
*Assistant Examiner* — Tamara Y. Washington
(74) *Attorney, Agent, or Firm* — Rahman LLC

(57) ABSTRACT

An example microelectromechanical system (MEMS) switch comprises a hinge plane having two or more intersecting hinges; a switch plate; and a plurality of electrostatic pads. Selective activation of the electrostatic pads causes torsion of at least one of the two or more intersecting hinges to tilt the switch plate to a selected one of three or more positions.

20 Claims, 5 Drawing Sheets

(51) Int. Cl.
  *G02B 26/12* (2006.01)
  *B81B 7/02* (2006.01)
  *B81B 3/00* (2006.01)
  *G03B 21/00* (2006.01)
(52) U.S. Cl.
  CPC ....... *G02B 26/0841* (2013.01); *G03B 21/008* (2013.01); *B81B 2201/042* (2013.01); *B81B 2201/045* (2013.01); *B81B 2203/0154* (2013.01); *B81B 2203/0361* (2013.01); *B81B 2203/04* (2013.01); *B81B 2207/053* (2013.01)
(58) Field of Classification Search
  CPC ................. G02B 26/0858; G02B 26/0816; G02B 26/10; G02B 26/08; B81B 2201/042; B81B 2201/033; B81B 2203/058; B81B 2203/0154; B81B 3/0045
  USPC ....................................... 359/200.6
  See application file for complete search history.

(56) References Cited

U.S. PATENT DOCUMENTS

| | | | |
|---|---|---|---|
| 6,433,917 B1 * | 8/2002 | Mei | G02B 26/0841 359/291 |
| 6,767,100 B1 | 7/2004 | Long et al. | |
| 6,781,731 B2 * | 8/2004 | Choi | G02B 26/0841 359/220.1 |
| 6,950,223 B2 | 9/2005 | Huibers et al. | |
| 6,960,305 B2 | 11/2005 | Doan et al. | |
| 7,755,830 B2 | 7/2010 | Ishii et al. | |
| 2003/0051331 A1 * | 3/2003 | Amatucci | B23Q 1/34 29/466 |
| 2009/0168146 A1 | 7/2009 | Hornbeck | |
| 2013/0293556 A1 | 11/2013 | Chan et al. | |
| 2015/0146210 A1 | 5/2015 | Nakanishi | |

FOREIGN PATENT DOCUMENTS

| | | |
|---|---|---|
| KR | 1020020071206 A | 9/2002 |
| WO | 2009032343 A1 | 3/2009 |

OTHER PUBLICATIONS

Irwin, WO2017069780, International Search Report, dated Oct. 23, 2015, 3 pages.

Douglass, M., "DMD reliability: a MEMS success story," Society of Photo-Optical Instrumentation Engineers, SPIE Proceedings vol. 4980, 2003, pp. 1-11.

* cited by examiner

MICROELECTROMECHANICAL DEVICE WITH MULTIPLE HINGES

BACKGROUND

Microelectromechanical systems (MEMS) devices have a variety of applications. One example of a MEMS device is a digital micromirror device (DMD). DMDs are typically used in projection systems. A DMD may include an array of micromirrors, each of which can be selectively positioned to one of two positions, an "ON" position or an "OFF" position. In the "ON" position, the mirror reflects light from a light source to a light path which may exit a projector. In the "OFF" position, the mirror reflects the light from the light source such that it does not follow the light path exiting the projector. Instead, the light may be reflected to a light absorber.

BRIEF DESCRIPTION OF THE DRAWINGS

For a more complete understanding of various examples, reference is now made to the following description taken in connection with the accompanying drawings in which.

DETAILED DESCRIPTION

Various examples described herein provide a MEMS device, such as a micromirror device, which can provide three or more positions. In one example, a micromirror device has four positions for reflecting light from different sources. The example micromirror device includes a hinge plane with two or more intersecting torsional hinges. The multiple torsional hinges provide can selectively output light reflected from one of multiple light sources. Thus, the example micromirror device can reflect light of different colors without the need for a color wheel, for example.

Figure 1:
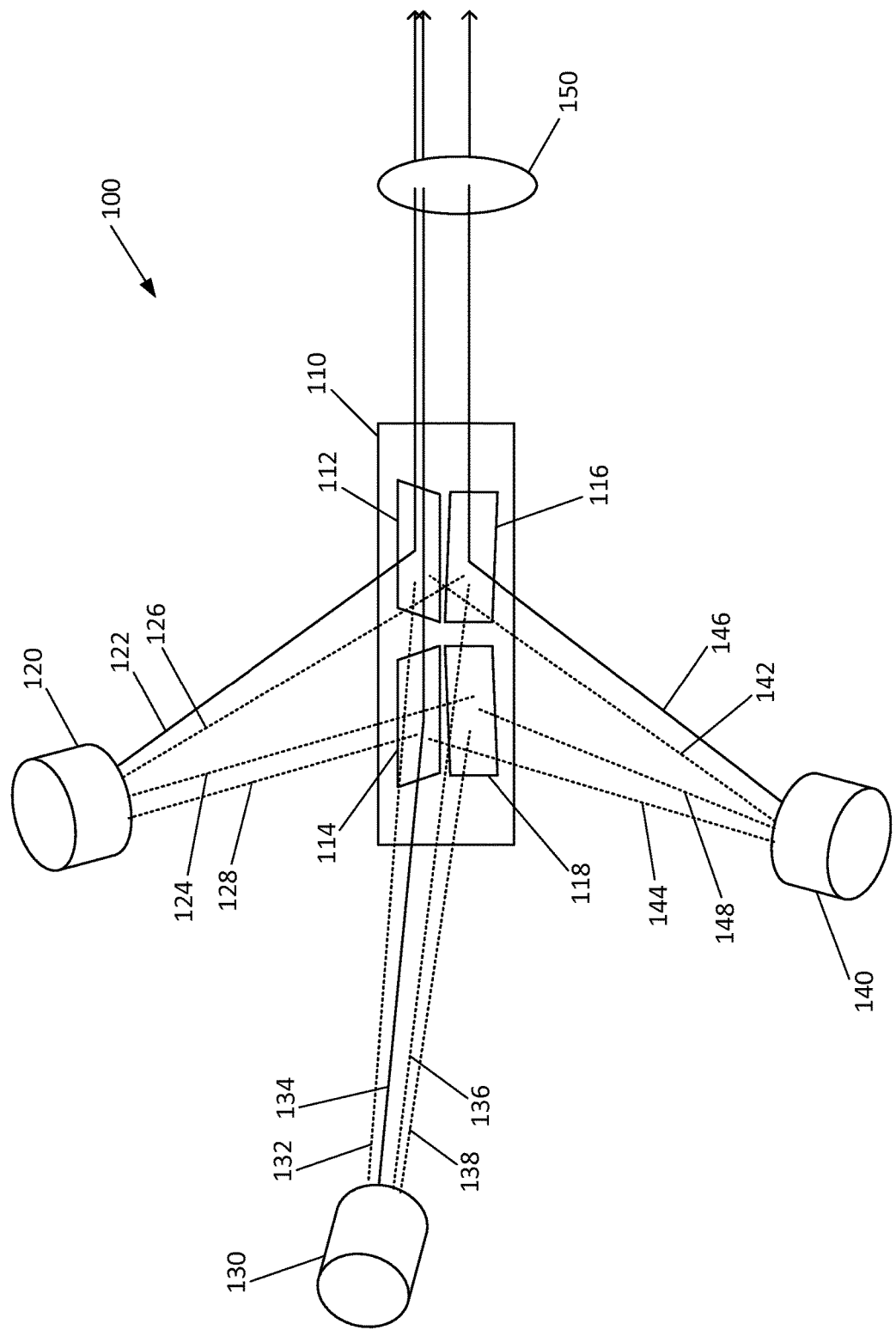
FIG. 1 illustrates an example micromirror projection system.

Referring now to FIG. 1, an example micromirror projection system 100 is illustrated. The example system 100 includes a micromirror array 110 with an array, or grid, of micromirror devices 112, 114, 116, 118. While the example system 100 of FIG. 1 is shown with four micromirror devices (or micromirrors), it will be understood that various examples may have many more micromirrors. For example, in one example, the micromirror array 110 may include a grid of 1024×768 micromirrors. In other examples, the micromirror array 110 may include grids of 1280×720 or 1920×1080. In various examples, each micromirror in the micromirror array corresponds to a single pixel in a projected image.

The example micromirror projection system 100 of FIG. 1 includes multiple light sources. In the example of FIG. 1, the system 100 includes three light sources 120, 130, 140. The light sources 120, 130, 140 may provide light of different colors. For example, the light source 120 may provide red light, the light source 130 may provide green light, and the light source 140 may provide blue light. Of course, in other examples, additional light sources of other colors may be provided.

The micromirror array 110 of the example system 100 is positioned such that light from the light sources 120, 130, 140 is selectively reflected by the micromirrors to an output, such as through an output lens 150. Of course, other examples may include additional components not shown in FIG. 1 for purposes of clarity.

The example micromirror devices 112, 114, 116, 118 may have three or more positions which may be selected to reflect light from the light sources 120, 130, 140 as desired. In the example of FIG. 1, the example system 100 includes micromirror devices 112, 114, 116, 118 that have four possible positions. For purposes of explanation, each of the micromirror devices 112, 114, 116, 118 are shown in FIG. 1 in a different one of the four possible positions. Each position is selected to reflect light from one of the three light sources 120, 130, 140 or to not reflect any light to the output lens 150.

In the example of FIG. 1, the light that is reflected to the output lens 150 is illustrated with a solid line, while light that is not reflected to the output lens 150 is illustrated with a dotted line. FIG. 1 illustrates shows the dotted lines terminating at the micromirror devices 112, 114, 116, 118. However, it should be understood that the light is reflected in a direction other than the output lens 150. In one example, the light depicted by the dotted lines may be reflected to a light absorber to inhibit indirect reflection.

Thus, in the example of FIG. 1, light from the first light source 120 may be red light, light from the second light source 130 may be green light, and light from the third light source 140 may be blue light. The light from each light source is directed to each micromirror device 112, 114, 116, 118 of the micromirror array 110, as illustrated by the lines extending from each light source 120, 130, 140 to each micromirror device 112, 114, 116, 118.

In the example of FIG. 1, the first micromirror device 112 is positioned to reflect light from the first light source 120 to the output lens 150. Similarly, the second micromirror device 114 is positioned to reflect light from the second light source 130 to the output lens 150, and the third micromirror device 116 is positioned to reflect light from the third light source 140 to the output lens 150. The fourth micromirror device 118 is positioned to reflect no light to the output, as may be the case when a black pixel is desired.

Thus, as illustrated in FIG. 1, the first micromirror device 112 is positioned to reflect light from the first light source 120 to the output lens 150. Light is directed to the first micromirror device 112 from each of the light sources 120, 130, 140. Light from the first light source 120, as indicated by the solid line 122, is reflected by the first micromirror device 112 to the output lens 150. On the other hand, light from all other light sources 130, 140, as indicated by the dotted lines 132, 142, is not directed to the output lens 150. Light from the other light sources 130, 140 may be reflected to one or more light absorbers (not shown), for example.

Similarly, as illustrated in FIG. 1, the second micromirror device 114 is positioned to reflect light from the second light source 130 to the output lens 150. Light is directed to the second micromirror device 114 from each of the light sources 120, 130, 140. Light from the second light source 130, as indicated by the solid line 134, is reflected by the second micromirror device 114 to the output lens 150. On the other hand, light from all other light sources 120, 140, as indicated by the dotted lines 124, 144, is not directed to the output lens 150. Light from the other light sources 120, 140 may be reflected to one or more light absorbers (not shown), for example.

The third micromirror device 116 in the example of FIG. 1 is positioned to reflect light from the third light source 140 to the output lens 150. Light is directed to the third micromirror device 116 from each of the light sources 120, 130, 140. Light from the third light source 140, as indicated by the solid line 144, is reflected by the third micromirror device 116 to the output lens 150. On the other hand, light from all other light sources 120, 130, as indicated by the dotted lines 126, 136, is not directed to the output lens 150. Light from the other light sources 120, 130 may be reflected to one or more light absorbers (not shown), for example.

The positions of the first, second and third micromirror devices 112, 114, 116 may be referred to as different "ON" positions. On the other hand, the position of the fourth micromirror device 118 may be referred to as an "OFF" position. In this regard, the fourth micromirror device 118 is positioned such that light from each of the light sources 120, 130, 140 is directed away from the output lens 150 and to a light absorber, for example. Accordingly, FIG. 1 illustrates each line 128, 138, 148 striking the fourth micromirror device 118 as a dotted line.

Figure 2:
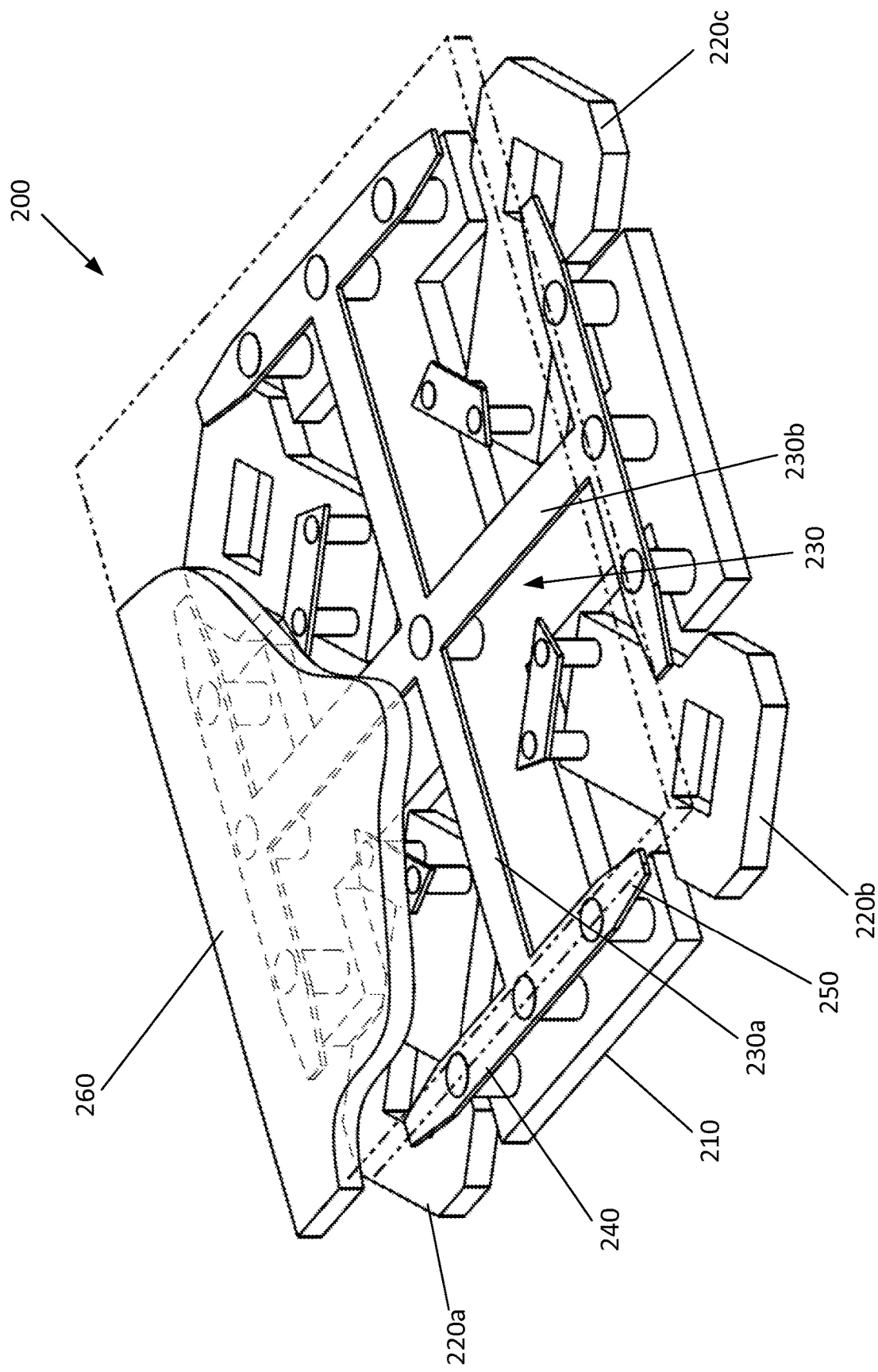
FIG. 2 is a perspective view of an example MEMS device.
Figure 3:
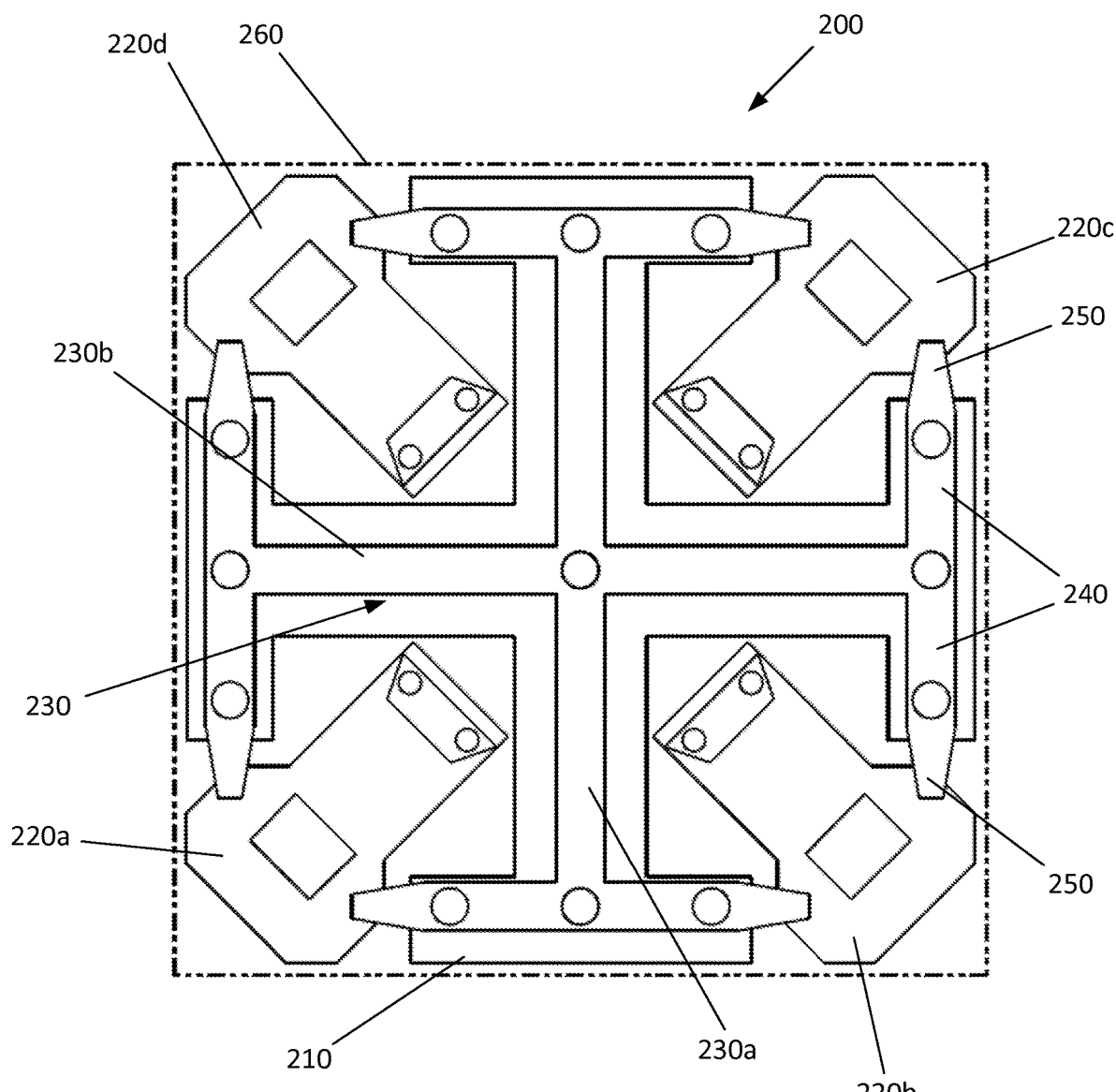
FIG. 3 is a plan view of the example MEMS device of FIG. 2.

Referring now to FIG. 2, a perspective view of an example MEMS device 200 is illustrated. FIG. 3 illustrates the example MEMS device 200 of FIG. 2 in a plan view. As noted above, the MEMS device 200 may be a micromirror device 112, 114, 116, 118 as illustrated in FIG. 1.

The example MEMS device 200 is in the shape of a square and accommodates a square plate 260. The square plate is shown partially cut away in FIG. 2 and not shown in FIG. 3 for purposes of clarity. In the example of a micromirror device, the square plate 260 may be a micromirror. The example MEMS device 200 of FIGS. 2 and 3 includes a substrate 210 to support certain components, as described below. In various examples, additional structure not shown in FIGS. 2 and 3 may be provided, such as a square base, for example.

The example MEMS device 200 includes three or more electrostatic pads (e.g., electrodes) 220a-d. In the example of FIGS. 2 and 3, the example MEMS device 200 is provided with four electrodes 220a-d. The electrodes 220a-d of the example MEMS device 200 are positioned at each corner of the square-shaped device 200. The electrodes 220a-d may be coupled to a controller (not shown) and may be selectively activated.

A hinge plane 230 is provided with two or more intersecting hinges. The hinge plane 230 may be mounted on the substrate 210 with a yoke (not shown) which allows selective movement of the hinge plane 230. In the example of FIGS. 2 and 3, the hinge plane 230 includes two intersecting hinges 230a and 230b. Each hinge 230a, 230b extends from approximately one edge of the square plate 260 to an opposite edge. Thus, each electrostatic pad 220a-d is positioned between two hinges. The hinges 230a, 230b are torsional hinges capable of torqueing (or twisting) about the length of the hinges 230a, 230b. In one example, the hinges are secured at each end and a middle portion of each hinge may be free to torque.

Each end of each hinge 230a, 230b may be provided with fingers 240 extending laterally from the hinge 230a, 230b. The length of each finger 240 is sufficient to allow a spring tip 250 at each end of the finger to reach an electrode 220a-d. Thus, as illustrated in FIGS. 2 and 3, each electrode 220a-d may be associated with two spring tips 250, each spring tip corresponding to one end of one hinge 230a, 230b.

In operation, a controller (not shown) may selectively activate one of the electrodes 220a-d. In this regard, the controller may cause a voltage to be applied to the selected electrode. The selection of the electrode may be indicated by appropriate software or firmware, for example. Activation of an electrode may generate electrostatic force which causes the spring tips 250 associated with the activated electrode to be attracted to the electrode. This electrostatic attraction causes the hinges 230a, 230b to torque in a manner which tilts the square plate 260 (e.g., the micromirror) towards the activated electrode. Thus, each electrode 220a-d corresponds to one position of the micromirror (e.g., the square plate 260). For example, in the case of the micromirror devices described above with reference to FIG. 1, each electrode may correspond to the positions illustrated for the micromirror devices 112, 114, 116, 118.

In one example, activation of an electrode generates sufficient electrostatic force to tilt the square plate by 10-15 degrees. When compared to torsion of a single hinge, the tilting of the square plate by torqueing two intersecting hinges may require an electrostatic force that is 2.83 (2*sqrt (2)) times as great.

In the example described above, the MEMS device 200 is a DMD device. In other examples, the MEMS device 200 may be a MEMS switch with three or more positions. In the example illustrated in FIGS. 2 and 3, the MEMS device 200 may be a single-pole, quad-throw (SPQT) switch. In this example, the square plate 260 may be a switch plate which serves as an electrode. Alternatively, the square plate 260 may be removed, and the hinge plane 230 may serve as an electrode. Each electrode 220a-d may correspond to one throw position of the switch. The electrostatic force generated upon activation of an electrode 220a-d may be sufficient to allow the activated electrode to make contact with the switch plate 260 or the hinge plane 230, for example. In this regard, the contact between the activated electrode and the switch plate 260 (e.g., the spring tips 250) may require electrical insulation or isolation of the switch plate 260 from other components to prevent electrical shorts. Of course, the pole and the throws may be swapped, and the MEMS device 200 may be a quad-pole, single-throw (QPST) switch.

Figure 4:
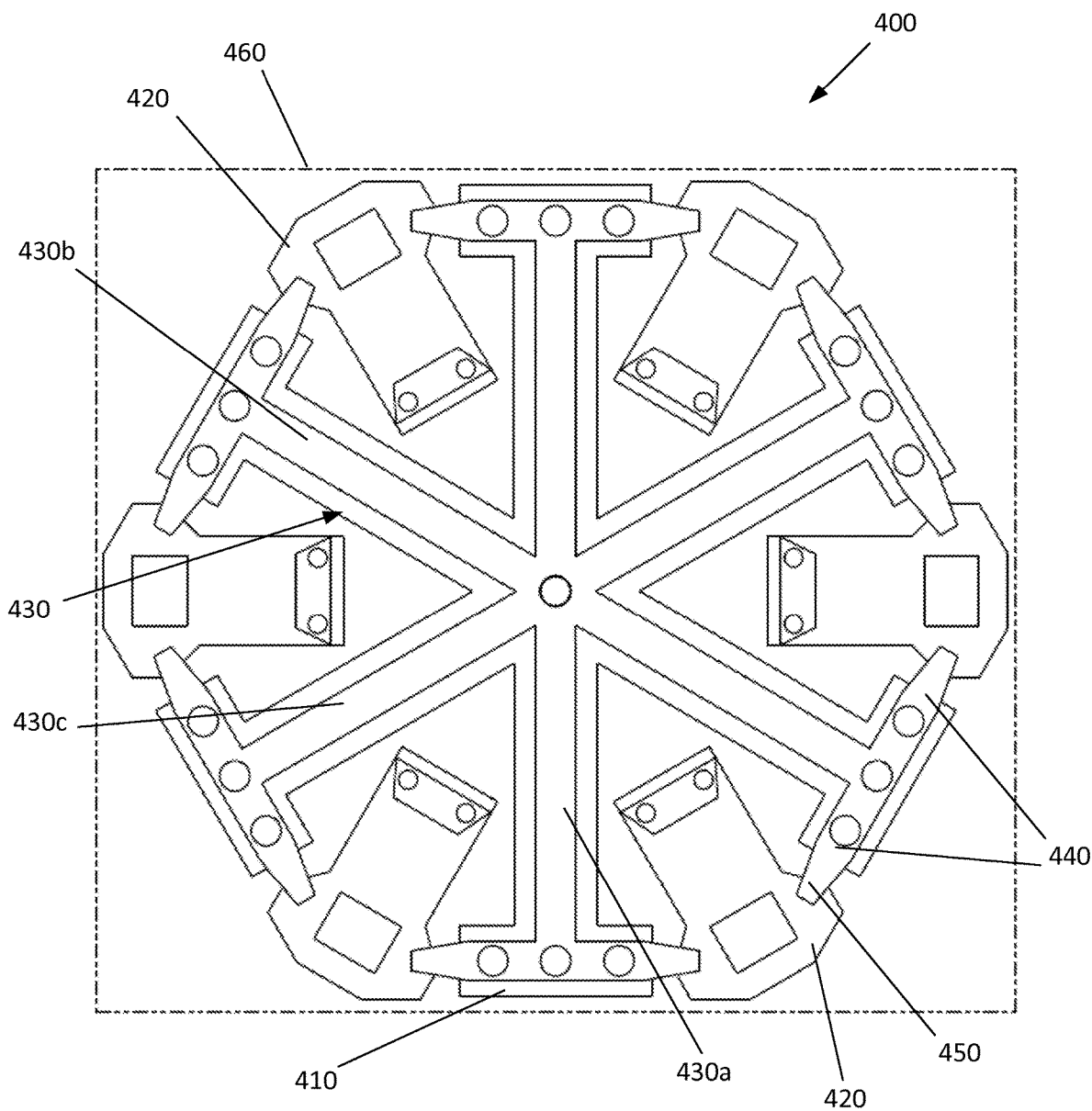
FIG. 4 is a plan view of another example MEMS device.
Figure 5:
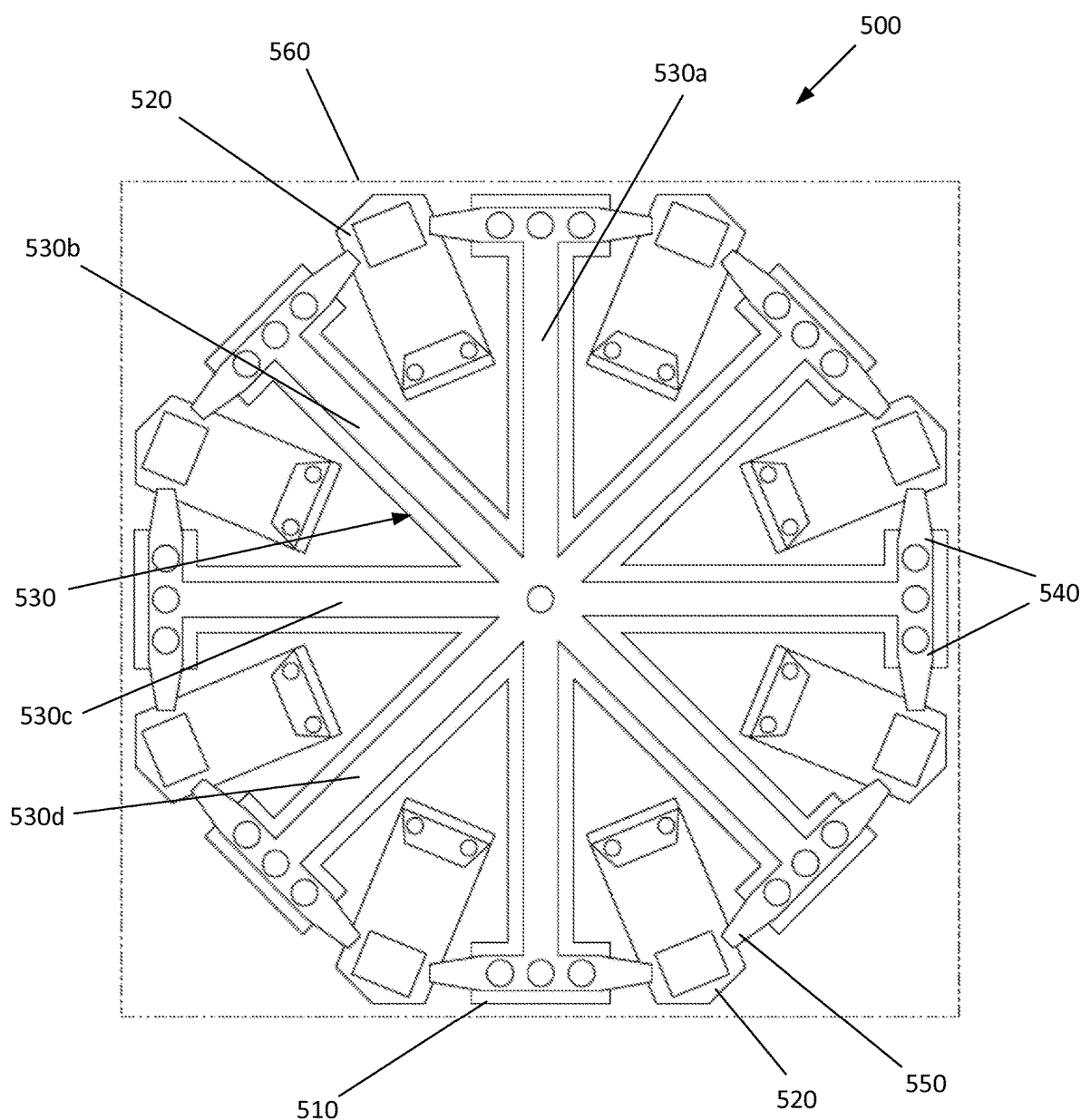
FIG. 5 is a plan view of another example MEMS device.

Referring now to FIGS. 4 and 5, plan views of other example MEMS devices 400, 500 are illustrated. The example MEMS device 400 of FIG. 4 is similar to that described above with reference to FIGS. 2 and 3 and includes a substrate 410 and a hinge plane 430. In the example of FIG. 4, the example MEMS device 400 is provided with three intersecting hinges 430a, 430b, 430c. Similar to the example MEMS device 200 of FIGS. 2 and 3, the example MEMS device 400 of FIG. 4 is provided with an electrostatic pad 420 between ends of each hinge 430a, 430b, 430c. Thus, the example MEMS device 400 includes six electrostatic pads 420 and may provide six possible positions.

In one example, the MEMS device 400 may be a DMD device with up to six positions. In other examples, the MEMS device 400 may be a MEMS switch. In particular, the MEMS device 400 may be a single-pole, hex-throw (SPHT) switch. Each electrode 420 may correspond to one throw position of the switch. Again, the pole and the throws may be swapped, and the MEMS device 400 may be a hex-pole, single-throw (HPST) switch.

Similarly, the example MEMS device 500 of FIG. 5 includes a substrate 510 and a hinge plane 530. In the example of FIG. 5, the example MEMS device 500 is provided with four intersecting hinges 530a, 530b, 530c, 530d. The example MEMS device 500 of FIG. 5 is provided with an electrostatic pad 520 between ends of each hinge 530a, 530b, 530c, 530d. Thus, the example MEMS device 500 includes eight electrostatic pads 520 and may provide eight possible positions.

In one example, the MEMS device 500 may be a DMD device with up to eight positions. In other examples, the MEMS device 500 may be a MEMS switch and, in particular, a single-pole, octo-throw (SPOT) switch. Each electrode 520 may correspond to one throw position of the switch. Again, the pole and the throws may be swapped, and the MEMS device 500 may be an octo-pole, single-throw (HPST) switch.

Of course, the electrostatic force required to tilt the plate (e.g., micromirror or switch plate) in the examples of FIGS. 4 and 5 increases with the increase in the number of hinges. Thus, in accordance with examples of the present disclosure, a hinge plane may be provided with any number of intersecting hinges as long as the physical space permits the hinges and the associated number of electrodes and sufficient electrostatic force can be generated.

The foregoing description of various examples has been presented for purposes of illustration and description. The foregoing description is not intended to be exhaustive or limiting to the examples disclosed, and modifications and variations are possible in light of the above teachings or may be acquired from practice of various examples. The examples discussed herein were chosen and described in order to explain the principles and the nature of various examples of the present disclosure and its practical application to enable utilizing the present disclosure in various examples and with various modifications as are suited to the particular use contemplated. The features of the examples described herein may be combined in all possible combinations of methods, apparatus, modules, systems, and computer program products. It is also noted herein that while the above describes examples, these descriptions should not be viewed in a limiting sense. Rather, there are several variations and modifications which may be made without departing from the scope as defined in the appended claims.

What is claimed is:

1. A microelectromechanical system (MEMS) switch, comprising:
    a hinge plane having two or more intersecting hinges, wherein the hinges intersect through a single point of the hinge plane;
    a switch plate extending over an entirety of the hinges;
    a plurality of electrostatic pads, wherein selective activation of the electrostatic pads causes torsion of at least one of the two or more intersecting hinges to tilt the switch plate to a selected one of three or more positions; and
    fingers extending from ends of the hinges.

2. The MEMS switch of claim 1, wherein each electrostatic pad is positioned between two hinges.

3. The MEMS switch of claim 1, wherein an activated electrostatic pad attracts fingers from two hinges to tilt the switch plate and form contact between the activated electrostatic pad and the switch plate.

4. The MEMS switch of claim 1, wherein each electrostatic pad is positioned oblique to the pair of hinges.

5. The MEMS switch of claim 1, wherein each finger overhangs a pair of electrostatic pads.

6. A device, comprising:
    a hinge plane having two or more intersecting hinges, wherein the hinges intersect through a single point of the hinge plane;
    a micromirror mounted on the hinge plane, wherein the micromirror extends over an entirety of the hinges;
    a plurality of electrostatic pads, wherein selective activation of the electrostatic pads causes torsion of at least one of the two or more intersecting hinges to tilt the micromirror to a selected one of three or more positions, and wherein each electrostatic pad is positioned oblique to the pair of hinges; and
    fingers extending from ends of the hinges.

7. The device of claim 6, wherein each electrostatic pad is positioned between two hinges.

8. The device of claim 6, wherein an activated electrostatic pad attracts fingers from two hinges to tilt the micromirror.

9. The device of claim 6, wherein the hinge plane includes two intersecting hinges, and the plurality of electrostatic pads includes four electrostatic pads.

10. The device of claim 9, wherein the micromirror is a square micromirror, and wherein each of the four electrostatic pads is positioned at a corner of the micromirror.

11. The device of claim 6, wherein each finger overhangs a pair of electrostatic pads.

12. A system, comprising:
    three or more light sources; and
    an array of micromirror devices, each micromirror device comprising:
        a hinge plane having two or more intersecting hinges, wherein the hinges intersect through a single point of the hinge plane;
        a micromirror mounted on the hinge plane, wherein the micromirror extends over an entirety of the hinges;
        a plurality of electrostatic pads, wherein selective activation of the electrostatic pads causes torsion of at least one of the two or more intersecting hinges to tilt the micromirror to a selected one of three or more positions; and
        a finger extending from an end of each hinge,
    wherein each of the three or more positions corresponds to reflection of light from a corresponding one of the three or more light sources to an output direction.

13. The system of claim 12, wherein the three or more light sources correspond to light of different colors.

14. The system of claim 13, wherein the different colors include red, green and blue.

15. The system of claim 12, wherein the hinge plane includes two intersecting hinges, and the plurality of electrostatic pads includes four electrostatic pads.

16. The system of claim 15, wherein selective activation of the electrostatic pads causes tilting of the micromirror to a selected one of four positions, the four positions corresponding to:
    (a) reflection of light from a first light source of the light sources to an output direction, the first light source being red light;
    (b) reflection of light from a second light source of the light sources to an output direction, the second light source being green light;
    (c) reflection of light from a third light source of the light sources to an output direction, the third light source being blue light; and
    (d) an off position.

17. The system of claim 16, wherein the off position includes reflection of light from a fourth light source of the light sources to an output direction, the third light source being black light.

18. The system of claim 16, wherein the off position includes reflection of no light to an output direction.

19. The system of claim 12, wherein each electrostatic pad is positioned oblique to the pair of hinges.

20. The system of claim 12, wherein each finger overhangs a pair of electrostatic pads.

\* \* \* \* \*